United States Patent [19]

Mang et al.

[11] Patent Number: 5,006,809
[45] Date of Patent: Apr. 9, 1991

[54] APPARATUS FOR MEASURING THE ELECTRICAL RESISTANCE OF A TEST SPECIMEN

[75] Inventors: Paul Mang; Hubert Driller, both of Schmitten, Fed. Rep. of Germany

[73] Assignee: Mania GmbH & Co., Weilrod, Fed. Rep. of Germany

[21] Appl. No.: 479,529

[22] Filed: Feb. 13, 1990

[30] Foreign Application Priority Data

Feb. 16, 1989 [EP] European Pat. Off. ............ 89102685

[51] Int. Cl.⁵ ............................................. G01R 27/08
[52] U.S. Cl. .................................... 324/715; 324/603; 324/719; 324/724
[58] Field of Search ................ 324/715, 713, 716, 717, 324/718, 719, 724, 693, 722, 603; 307/570, 446

[56] References Cited

U.S. PATENT DOCUMENTS

| 3,495,164 | 2/1970 | Dauphinee | 324/715 X |
| 3,609,539 | 9/1971 | Gunthert | 324/72.5 |
| 3,946,309 | 3/1976 | Roughton | 324/717 |
| 3,974,443 | 8/1986 | Thomas . | |
| 3,978,472 | 8/1976 | Jones | 324/715 X |
| 4,050,017 | 9/1977 | Paufve | 324/715 X |
| 4,179,652 | 12/1979 | Davis | 324/715 |
| 4,706,015 | 11/1987 | Chen . | |
| 4,887,025 | 12/1989 | ReFiorentin et al. | 324/713 X |

FOREIGN PATENT DOCUMENTS 3615550 12/1987 Fed. Rep. of Germany .

Primary Examiner—Kenneth Wieder
Assistant Examiner—Robert W. Mueller
Attorney, Agent, or Firm—Wenderoth, Lind & Ponack

[57] ABSTRACT

An apparatus for measuring the resistance of a test specimen includes an insulated-gate-bipolar-transistor (IGBT transistor) which is provided for applying a test current to the test specimen. A voltage measuring unit is provided including a serial connection of a voltage measuring device and an MOS transistor. A current measuring device is provided for measuring the test flowing through the test specimen. The voltage measured by the voltage measuring unit is used to compensate for the voltage drop across the IGBT transistor when calculating the resistance of the test specimen.

18 Claims, 4 Drawing Sheets

APPARATUS FOR MEASURING THE ELECTRICAL RESISTANCE OF A TEST SPECIMEN

BACKGROUND OF THE INVENTION

1. Field of the Invention.

The present invention relates to a resistance measurement device, and more particularly, to an apparatus for measuring the electrical resistance of a test specimen.

2. Description of the Related Art.

When measuring the resistance of a test specimen, such as a conductor of a printed circuit board, it is known that inaccuracies arise since the semiconductor switches for triggering the conductor are not ideal switches. More specifically, a residual current flows via a parallel resistance when the semiconductor switch is open, whereas a voltage drop results at a series resistance when the semiconductor switch is closed. Accordingly, when the semiconductor switch is closed (i.e., when an electrical connection is made to the test-specimen), the voltage drop at the series resistance results in inaccuracies in the resistance measurement.

Accordingly, in an effort to obviate the above-noted inaccuracies in the resistance measurement, it is known to measure the resistance of a test specimen according to the "Kelvin Method". According to this method, as shown in FIG. 1, electrical connection to the test-specimen 7 is effected via two parallel connected semiconductor switches 1, 2. A test current $I_p$ is applied to the test-specimen 7 via semiconductor switch 1 and its associated resistor 3. The voltage drop across resistor 3 is measured by the voltage-measuring device 12 which is connected in series with the semiconductor switch 2. To effect the resistance measurement, the semiconductor switch 1 and the semiconductor switch 2 are closed simultaneously.

According to this method, the voltage drop appearing across resistor 3 up to node 5 is compensated for in the resistance measurement. As shown in FIG. 1, the test-specimen 7 is a portion of a conductor of a printed circuit board 8, and the resistance measurement is effected between test probes 9 and 10. Reference numeral 11 denotes a current measurement device for measuring the current flowing through the test-specimen.

SUMMARY OF THE INVENTION

The object of the present invention is to provide an improved circuit configuration for measuring the resistance of a test-specimen.

The above and other objects are effected by the particular selection of an insulated-gate-bipolar-transistor (herein after IGBT-type transistor) as the semiconductor switch for providing the test current $I_p$, and an MOS-type transistor as the semiconductor switch provided in the voltage measuring circuit.

According to the configuration of the present invention, the following advantageous properties are achieved:

(1) The lower consumption of the circuit for applying the test current is extremely low. As a result, the crystal temperature of the semiconductor material is not appreciably increased during switch-through of the IGBT transistor. Accordingly, residual current due to heating is not increased when the IGBT transistor is switched-off.

(2) The current flowing through the voltage measuring circuit is extremely small (in the micro-amphere range) and, accordingly, the voltage loss at the comparatively high series resistor 4 (see FIG. 1) is negligible, thereby decreasing significantly inaccuracies in the resistance measurement.

(3) Manufacturing of the circuit according to the present invention is facilitated in that the IGBT transistor and the MOS transistor can be manufactured using the same mask.

(4) The relatively long switching time of the IGBT transistor is accounted for, since difficulties in their use in circuits for measurement and testing do not arise in the kHz range.

BRIEF DESCRIPTION OF THE DRAWINGS

The invention will be described in more detail below with reference to the exemplified embodiments thereof illustrated in the accompanying drawings, in which.

DESCRIPTION OF THE PREFERRED EMBODIMENTS

Figure 1:
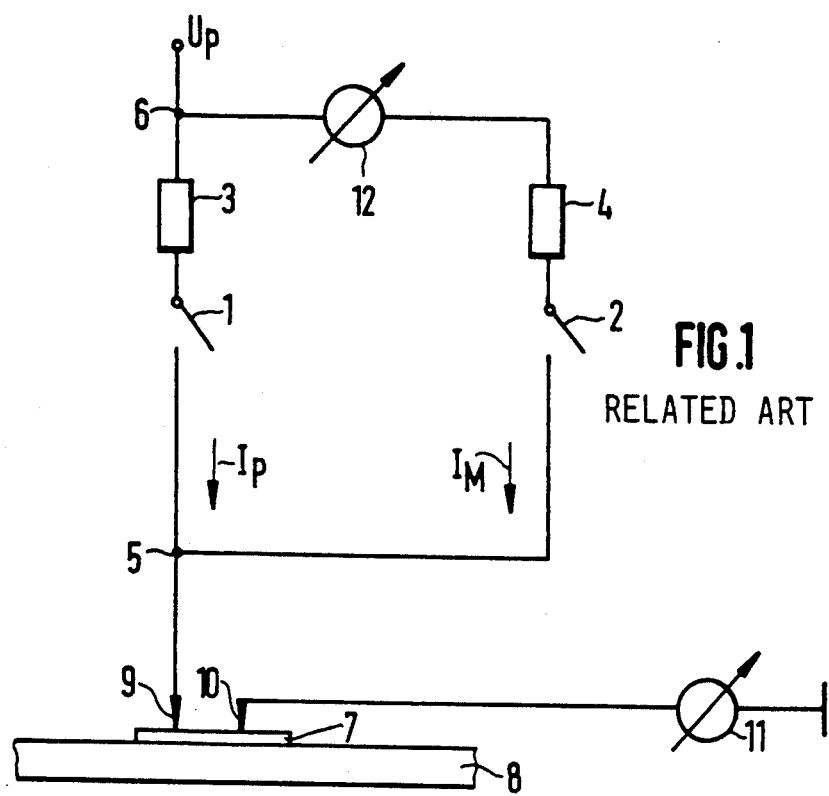
FIG. 1 illustrates a known test circuit for measuring the resistance of a test-specimen.
Figure 2:
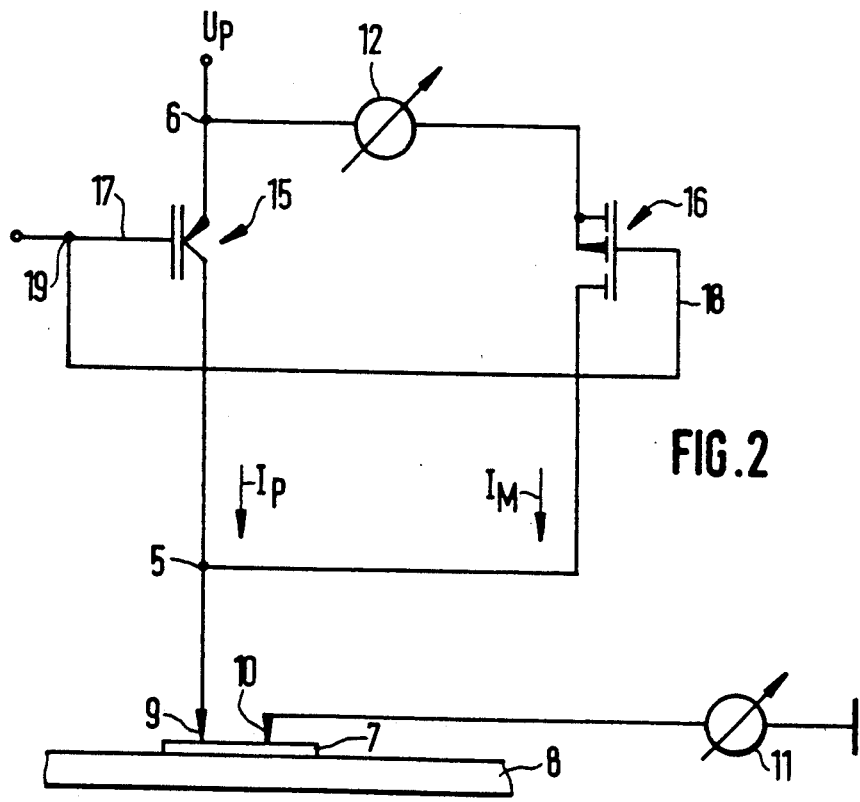
FIG. 2 illustrates an embodiment of the present invention for measuring the resistance of a test-specimen.

Reference is made to FIG. 2 for a detailed description of one embodiment of the present invention. It is noted that like components as previously discussed in connection with FIG. 1 are denoted by like reference numerals.

As shown in FIG. 2, the semiconductor switch 1 of the test circuit shown in FIG. 1 has been replaced by an IGBT transistor 15, which is triggered by a control connection 17. Furthermore, the semiconductor switch 2 of the voltage measuring circuit of FIG. 1 has been replaced by an MOS transistor 16, which is triggered by a control connection 18. The control connections 17, 18 are preferably connected together at node 19 so that the IGBT transistor 15 and the MOS transistor 16 can be triggered or clocked simultaneously.

To effect the resistance measurement of the test-specimen 7, a switch-on potential is applied to node 19, so that transistor 15 and 16 are simultaneously activated. The test current $I_p$ flowing through the conducting IGBT transistor 15 and the portion of the test-specimen located between the test probes 9, 10 is measured by the current-measuring device 11. Simultaneously, the voltage drop across the IGBT transistor 15 and the portion of the conductor between the IGBT transistor 15 and node 5 is measured by the voltage measuring device 12 of the voltage measuring circuit. That is, the voltage measuring circuit is comprised of the voltage measuring device 12 and the MOS transistor 16.

The resistance measurement of the test-specimen which is calculated in accordance with a reference voltage $I_p$ and the current measured by the current-measuring device 11 is corrected in accordance with the voltage drop measured by the voltage measuring device 12. Accordingly, the thus corrected measurement provides accurate information regarding the resistance of the test-specimen between probes 9 and 10.

A salient feature of the present invention resides in the provision of the IGBT transistor 15 for supplying the test current $I_p$. The IGBT transistor 15 serves as a power adjuster having a relatively low power loss, and is therefore only slightly heated during switch-through. This characteristic of the IGBT transistor is particularly important in avoiding a temperature-dependent residual current, resulting from an extended switch-through time period, when the IGBT transistor 15 is switched off.

Furthermore, it is not relevant that the IGBT transistor has a relatively poor linearity, since the actual voltage drop at the IGBT transistor will in any case be subsequently measured by the voltage measuring circuit having the MOS transistor 16, which has excellent linearity.

Furthermore, since in any case the voltage measuring current $I_m$ flowing in the voltage measuring circuit is not large, it is also not relevant that the MOS transistor is not designed for a relatively large current. The important feature of the MOS transistor 16 is that it provides a means for accurately measuring the voltage drop across the IGBT transistor 15.

Figure 3:
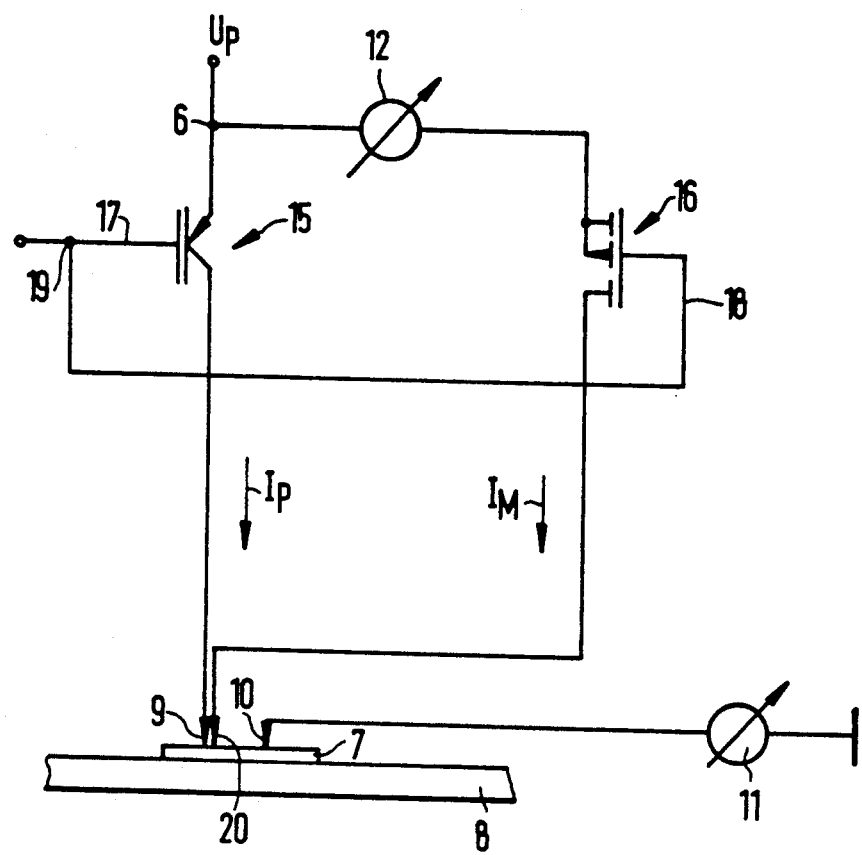
FIG. 3 illustrates an alternative arrangement for connecting to the test-specimen of the embodiment shown in FIG. 2.

The circuit as shown in FIG. 2 can measure the voltage drop only so far as node 5. FIG. 3 illustrates a circuit in which the voltage drop is measured across the IGBT transistor 15 as well as the test probe 9, thereby improving the accuracy of the resistance measurement.

As shown in FIG. 3, an additional test probe 20 is provided for directly connecting to the MOS transistor 16. The additional test probe 20 is made to contact the test-specimen 7 in close proximity to the test probe 9. By this configuration, the voltage measuring circuit measures the voltage drop appearing across the IGBT transistor 15 and the entire connection from the IGBT transistor 15 to the test probe 9. Therefore, the configuration of FIG. 3 more accurately compensates for the voltage drop of the circuit for applying the test current $I_p$.

Figure 4:
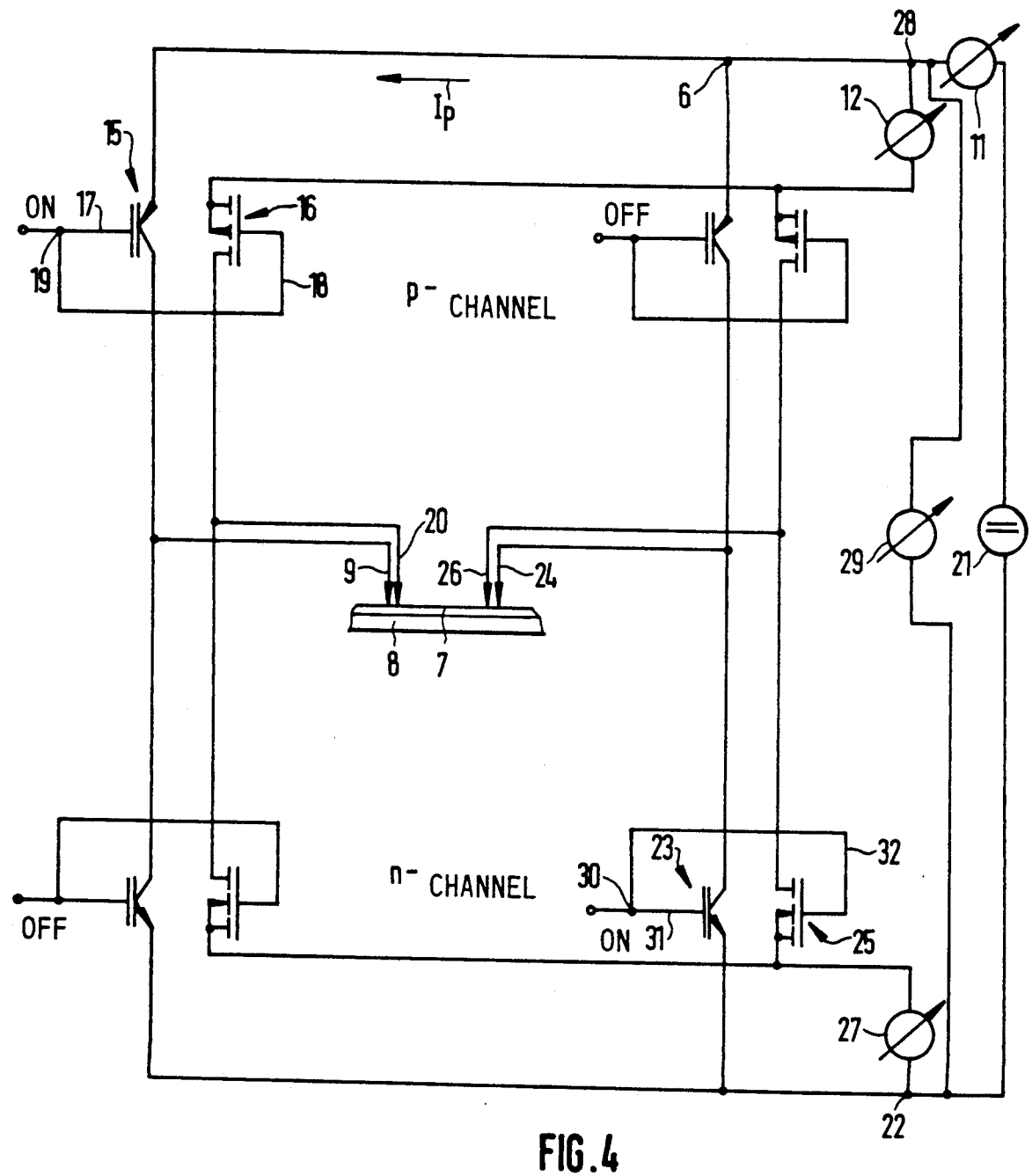
FIG. 4 illustrates another embodiment of the present invention for measuring the resistance of a test-specimen.

Reference is now made to FIG. 4 for a description of another embodiment of the present invention. The circuit configuration of FIG. 4 provides a means for compensating for all the voltage drops of the entire resistance measuring circuit, i.e., the voltage drops appearing on both sides of the test-specimen 7. It is noted that like components as discussed above are denoted by like reference numerals in FIG. 4.

In the manner described above in connection with FIG. 3, one side (i.e., the left hand side as shown in FIG. 4) of the test-specimen 7 is connected to test probes 9 and 20. The test current $I_p$ which is impressed by the current source 21, flows between nodes 6 and 22. Node 6 is connected via IGBT transistor 15 to test probe 9, and is connected via the voltage-measuring device 12 and the MOS transistor 16 to test probe 20. The IGBT transistor 15 and the MOS transistor 16 can be switched on and off simultaneously by applying a control voltage to node 19. Accordingly, the voltage-measuring device 12 provides an accurate measurement of the voltage drop appearing between node 6 and the test probe 9, since the test probe 9 and the test probe 20 are located in close proximity to each other.

Additional circuitry is provided for the right hand side of the test specimen 7. This additional circuitry includes an IGBT transistor 23, which is connected between test probe 24 and node 22. A second voltage measuring circuit is provided including the MOS transistor 25 and the voltage-measuring device 27 connected between test probe 26 and node 22. Control connections 31, 32 of the IGBT transistor 23 and the MOS transistor 25 are coupled together at node 30 so that the IGBT transistor 23 and the MOS transistor 25 can be switched on and off simultaneously.

The output 28 of the current-measuring device 11 is connected to the output 22 of the voltage-measuring device 27 via a third voltage-measuring device 29. If transistors 15, 16, 23 and 25 are simultaneously switched on by applying a control voltage to nodes 19 and 30, a test current $I_p$ measured by the current-measuring device 11 will flow between nodes 6 and 22 via the IGBT transistor 15, the test probe 9, the test-specimen 7, the test probe 24, and the IGBT transistor 23.

Consequently, the voltage-measuring device 12 provides a measurement of the voltage-drop between nodes 6 and test probe 9. Similarly, the voltage-measuring device 27 provides a measurement of the voltage drop between test probe 24 and node 22. The voltage-measuring device 29 can thus be used to determine a differential voltage corresponding to the voltage drop across the test-specimen 7. More particularly, the voltage drop across the test-specimen 7 corresponds to a difference between the voltage measured by the voltage-measuring device 29 and a sum of the voltages measured by the voltage-measuring devices 12 and 27. The resistance of the test-specimen 7 thus corresponds to the calculated differential voltage appearing across the test-specimen 7 divided by the test current $I_p$.

Figure 5:
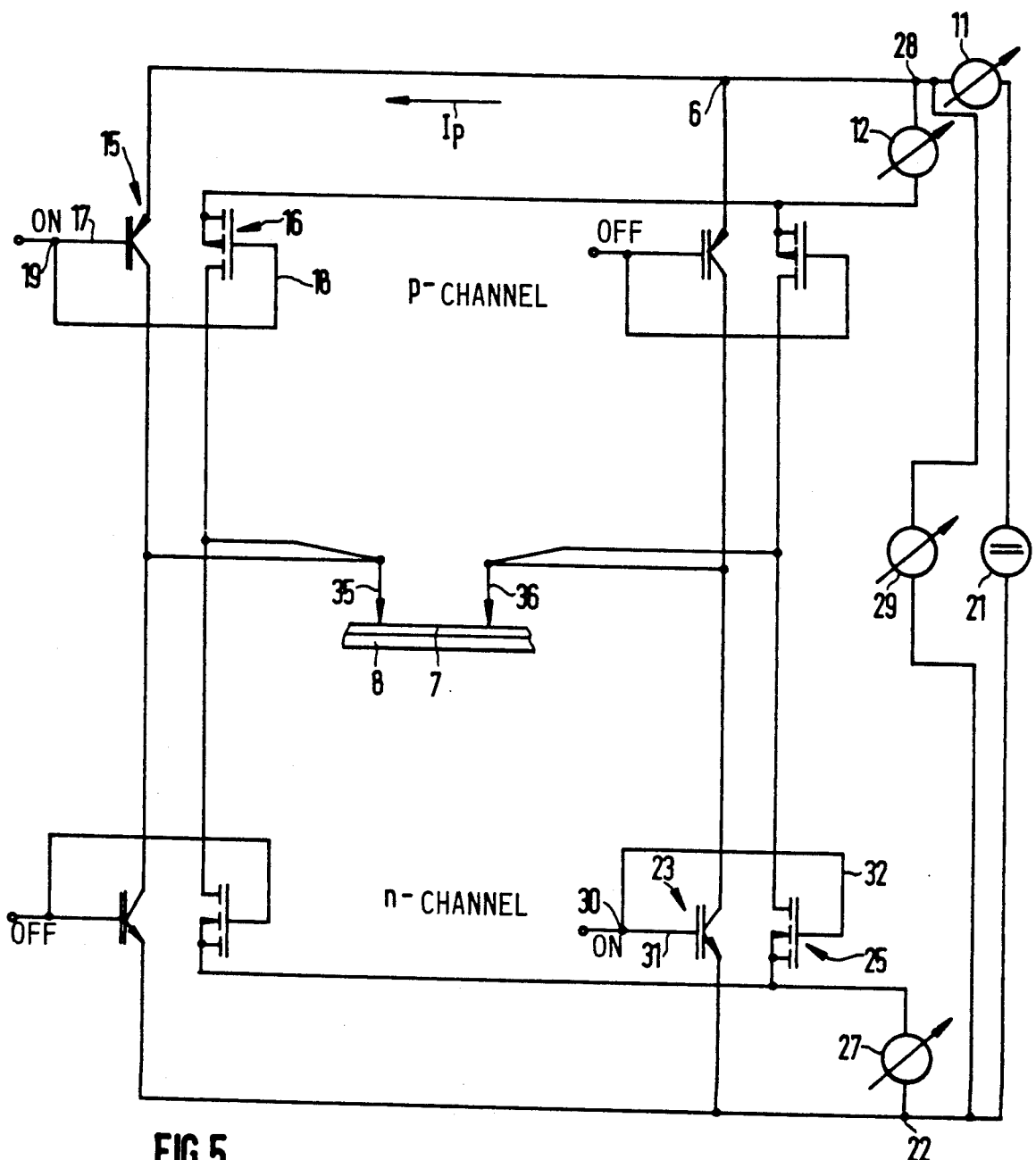
FIG. 5 illustrates an alternative arrangement for connecting to the test-specimen of the embodiment shown in FIG. 4.

FIG. 5 illustrates the embodiment shown in FIG. 4 except that the resistance measuring circuit is connected to the test-specimen 7 via a single test probe disposed on each side thereof. That is, on the left hand side of the test-specimen 7, a test probe 35 establishes electrical connection between the test-specimen 7 and the IGBT transistor 15 and the MOS transistor 16. Similarly, on the right hand side of the test-specimen 7, a test probe 36 establishes electrical connection between the test-specimen 7 and the IGBT transistor 23 and the MOS transistor 25. The resistance measurement is effected in the same manner as described above in connection with FIG. 4, except that the voltage drop appearing across the test probes 35 and 36 cannot be measured and compensated for. The connecting arrangement of FIG. 5, however, is much simpler in construction, since only two test probes 35, 36 are necessary, thereby possibly offsetting the slightly lower accuracy of the resistance measurement.

As shown in FIGS. 4 and 5, additional pairs of transistors may optionally be provided. For example, the pair of transistors shown to the immediate left of transistors 23, 25 as shown in FIGS. 4 and 5 may be provided for testing an additional portion of the test-specimen 7. That is, these transistors may be provided connected to test probes 9, 20 as shown in FIG. 4, or test probe 35 as shown in FIG. 5, to cooperate with another pair of transistors (not shown) which are associated with and connected to another pair of test probes (not shown) which are electrically connected to another portion of the test-specimen 7. Similarly, the pair of transistors shown to the immediate right of transistors 15, 16 in FIGS. 4 and 5 can be used to measure the resistance of a third portion of the test-specimen 7 by cooperating with yet another pair of transistors (not shown). These additionally provided sets of transistors are maintained in an off-state while transistors 15, 16, 23 and 25 are being used for the resistance measurement.

Furthermore, in the event that asymmetrical triggering is desired, the types of transistors used in the resistance measurement are preferably complimentary as shown in FIGS. 1 and 5. That is, to facilitate asymmetrical triggering, the p-channel transistors are provided to switch on in response to a negative voltage applied at node 19, and the n-channel transistors are provided to switch on in response to a positive voltage appearing at node 30.

Figure 6:
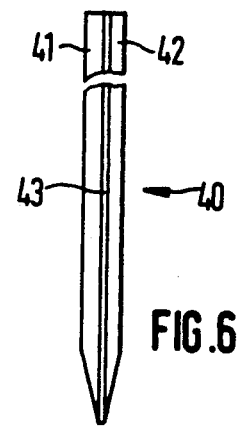
FIG. 6 illustrates a test-pin for connecting to the test-specimen.

FIG. 6 illustrates a test pin that may be used instead of the individual test probes described above. The test-pin 40 is manufactured by electrically isolating two test-pin parts 41, 42 from one another and then combining them at the test-pin tip. That is, the test-pin parts 41, 42 are electrically isolated from each other along the length of the test-pin 40 by the insulator 43. Accordingly, test probes 9, 20 and test probes 24, 26 can be combined into single test-pin units.

It is to be understood that modifications may be made to the above-described embodiments without departing from the scope of the present invention.

We claim:

1. An apparatus for measuring a resistance of a test specimen, said apparatus comprising:
   first and second test probe terminal means each for electrically connecting to the test specimen;
   supply terminal means for applying thereto a reference power source;
   current measuring means, coupled to said second test probe terminal means, for measuring an electric current flowing through the test specimen;
   first semiconductor switching means, coupled to said first test probe terminal means and said supply terminal means, for activating to allow an electric current to pass therethrough; and,
   first voltage measuring means, coupled to said first semiconductor switching means and said first test probe terminal means, for measuring a voltage across at least said first semiconductor switching means;
   said first voltage measuring means including a serial connection of a first voltage measuring device and a second semiconductor switching means for activating to allow an electric current to pass therethrough;
   said first semiconductor switching means including an insulated-gate-bipolar-transistor;
   said second semiconductor switching means including a field-effect transistor.

2. An apparatus as recited in claim 1, further comprising means for simultaneously activating said first and second semiconductor switching means.

3. An apparatus as recited in claim 2, wherein said field-effect transistor is a MOS-type transistor.

4. An apparatus as recited in claim , wherein said field-effect transistor is a MOS-type transistor.

5. An apparatus as recited in claim 1, wherein said first voltage measuring means is coupled in parallel to a serial connection of said first semiconductor switching means and said first test probe terminal means.

6. An apparatus as recited in claim 5, further comprising a first test probe coupled to said first test probe terminal means, said first voltage measuring means being electrically connected to said first test probe terminal means in close proximity to said first test probe.

7. An apparatus as recited in claim 1, wherein said first test probe terminal means includes a first conductor electrically connected to said first semiconductor switching means and a second conductor electrically connected to said first voltage measuring means.

8. An apparatus as recited in claim 7, further comprising first and second test probes respectively coupled to said first and second conductors.

9. An apparatus as recited in claim 8, wherein said first and second test probes are formed into a single test pin device having first and second electrical conductors which are insulated from each other.

10. An apparatus as recited in claim 1, further comprising:
    third semiconductor switching means, coupled to said second test probe terminal means, for activating to allow an electric current to pass therethrough;
    second voltage measuring means, coupled to said third semiconductor switching means and said second test probe terminal means, for measuring a voltage across at least said third semiconductor switching means;
    said second voltage measuring means including a serial connection of a second voltage measuring device and a fourth semiconductor switching means for activating to allow an electric current to pass therethrough;
    said current measuring means being coupled to said second test probe terminal means through said third semiconductor switching means and said second voltage measuring means;
    said third semiconductor switching means including an insulated-gate-bipolar-transistor;
    said fourth semiconductor switching means including a field-effect transistor.

11. An apparatus as recited in claim 10, further comprising means for simultaneously activating said first, second, third and fourth semiconductor switching means.

12. An apparatus as recited in claim 11, wherein said field-effect transistors of said second and fourth semiconductor switching means are MOS-type transistors.

13. An apparatus as recited in claim 10, wherein said field-effect transistors of said second and fourth semiconductor switching means are MOS-type transistors.

14. An apparatus as recited in claim 10, wherein said first voltage measuring means is coupled in parallel to a serial connection of said first semiconductor switching means and said first test probe terminal means, and said second voltage measuring means is coupled in parallel to a serial connection of said third semiconductor switching means and said second test probe terminal means.

15. An apparatus as recited in claim 14, further comprising a first test probe coupled to said first test probe terminal means and a second test probe coupled to said second test probe terminal means, said first voltage measuring means being electrically connected to said first test probe terminal means in close proximity to said first test probe, said second voltage measuring means being electrically connected to said second test probe terminal means in close proximity to said second test probe.

16. An apparatus as recited in claim 10, wherein said first test probe terminal means includes a first conductor electrically connected to said first semiconductor switching means and a second conductor electrically connected to said first voltage measuring means, and wherein said second test probe terminal means includes a third conductor electrically connected to said third semiconductor switching means and a fourth conductor electrically connected to said second voltage measuring means.

17. An apparatus as recited in claim 16, further comprising first and second test probes respectively coupled to said first and second conductors, and third and fourth test probes respectively coupled to said third and fourth conductors.

18. An apparatus as recited in claim 17, wherein said first and second test probes are formed into a first single test pin device having first and second electrical conductors which are insulated from each other, and wherein said third and fourth test probes are formed into a second single test pin device having third and fourth electrical conductors which are insulated from each other.

* * * * *

UNITED STATES PATENT AND TRADEMARK OFFICE
CERTIFICATE OF CORRECTION

PATENT NO. : 5,006,809
DATED : April 9, 1991
INVENTOR(S) : Paul MANG et al.

It is certified that error appears in the above-indentified patent and that said Letters Patent is hereby corrected as shown below:

Column 5, line 56, change "2" to --1--.

Column 5, line 58, after "claim" insert --2--.

Signed and Sealed this

Eleventh Day of April, 1995

Attest:

BRUCE LEHMAN

Attesting Officer        Commissioner of Patents and Trademarks